United States Patent [19]

Shirai et al.

[11] 4,209,702
[45] Jun. 24, 1980

[54] MULTIPLE ELECTRON LENS

[75] Inventors: Shogo Shirai, Yokohama; Akira Onoguchi, Chofu, both of Japan

[73] Assignee: Kabushiki Kaisha Akashi Seisakusho, Japan

[21] Appl. No.: 924,249

[22] Filed: Jul. 13, 1978

[30] Foreign Application Priority Data

Jul. 25, 1977 [JP] Japan .................................. 52-88962

[51] Int. Cl.[2] .............................................. G21K 1/08
[52] U.S. Cl. ............................. 250/396 ML; 313/409; 313/443
[58] Field of Search ....................... 313/442, 443, 409; 250/396 ML

[56] References Cited

U.S. PATENT DOCUMENTS

| 2,950,390 | 8/1960 | Haine et al. .......................... 313/443 |
| 2,973,433 | 2/1961 | Kramer ................................. 313/443 |
| 3,715,580 | 2/1973 | Maekawa et al. ............. 250/396 ML |
| 3,852,597 | 12/1974 | Yanaka et al. .................... 250/396 R |

OTHER PUBLICATIONS

Automated Electron Beam Generator by Friedmann et al., J. Vac. Sci. Tech., vol. 10, No. 6, Nov./Dec. 1973, pp. 1020-1023.
Computer Controlled Electron Beam . . . System by Saitov et al., Journal of Physics E: Sci. Inst., 1974, vol. 1, pp. 441-444.

*Primary Examiner*—Harold A. Dixon
*Attorney, Agent, or Firm*—Robert E. Burns; Emmanuel J. Lobato; Bruce L. Adams

[57] ABSTRACT

A multiple electron lens having two axially spaced polepieces defining a space therebetween. The polepieces each have a plurality of axial through openings aligned coaxially defining electron beam paths. A sole anode plate is disposed axially spaced from the polepieces and has openings aligned with the openings defining the beam paths and equal in number thereto. Each beam path has an auxiliary exciting coil and a corresponding stigmator coaxially arranged with the related beam path within the space defined between the polepieces.

2 Claims, 9 Drawing Figures

MULTIPLE ELECTRON LENS

BACKGROUND OF THE INVENTION

This invention relates generally to electron lens to focus electron beams and more particularly to a new and improved multiple electron lens.

Electron beam lenses are well known. These known beam lenses are generally constructed with a main exciting coil and are not provided with auxiliary exciting coils to focus the electron beams individually.

SUMMARY OF THE INVENTION

It is an object of the present invention to provide an electron beam lens that is capable of simultaneously irradiating several areas of a specimen unaffected by deflective and aperture aberrations.

It is another object of the present invention to provide a multiple electron beam lens having a plurality of electron beam paths to generate a plurality of closely spaced irradiating electron beams to simultaneously expose a plurality of areas on a specimen to increase operating efficiency.

Another object of the present invention is to provide an electron beam lens with an individual stigmator for each electron beam path for independently accurately correcting astigmatism of each electron beam.

Still another object of the present invention is to provide an electron beam lens having a plurality of beam paths for electron beams and an auxiliary exciting coil for each electron beam for independently accurately focusing each irradiating electron beam.

The multiple electron beam lens according to the invention can perform accurate focusing and astigmation correction with respect to each individual irradiating electron beam which is conducive to the accurate reproduction of an image.

The multiple electron lens has two polepieces opposed to each other and axially spaced to define a space therebetween. The polepieces have a corresponding number of axial openings or bores aligned and functioning as electron beam paths. A sole anode is disposed coaxially spaced from the polepieces and has a corresponding number of through openings. Each electron beam path has a corresponding coaxial auxiliary exciting coil and a corresponding cool stigmator disposed with the space between the polepieces.

BRIEF DESCRIPTION OF THE DRAWINGS

Other features and objection of the multiple electron lens according to the invention will become apparent from the appended claims and drawings in which:

DESCRIPTION OF THE PREFERRED EMBODIMENTS

Figure 1:
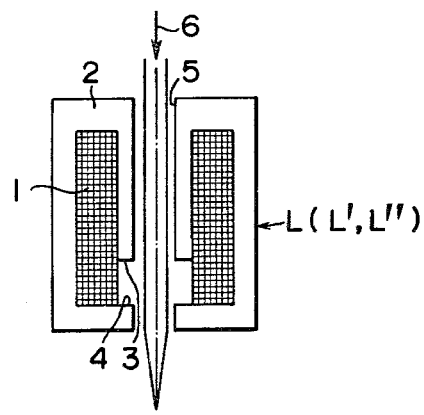
FIG. 1 is a longitudinal cross section view of a known electron lens.

As illustrated in FIG. 1, a vertical cross-sectional view of a conventional electron lens, the conventional electron lens comprises a cylindrical yoke 2 that carries an exciting coil 1 and is provided with a single electron beam path 5 extending perpendicular to opposite magnetic pole surfaces 3 and 4 and coaxially with the yoke 2. When an accelerated electron beam 6 passes through the electron beam path 5, a magnetic field produced between the upper and lower magnetic pole surfaces 3 and 4 acts upon to focus it at a desired point.

Figure 2:
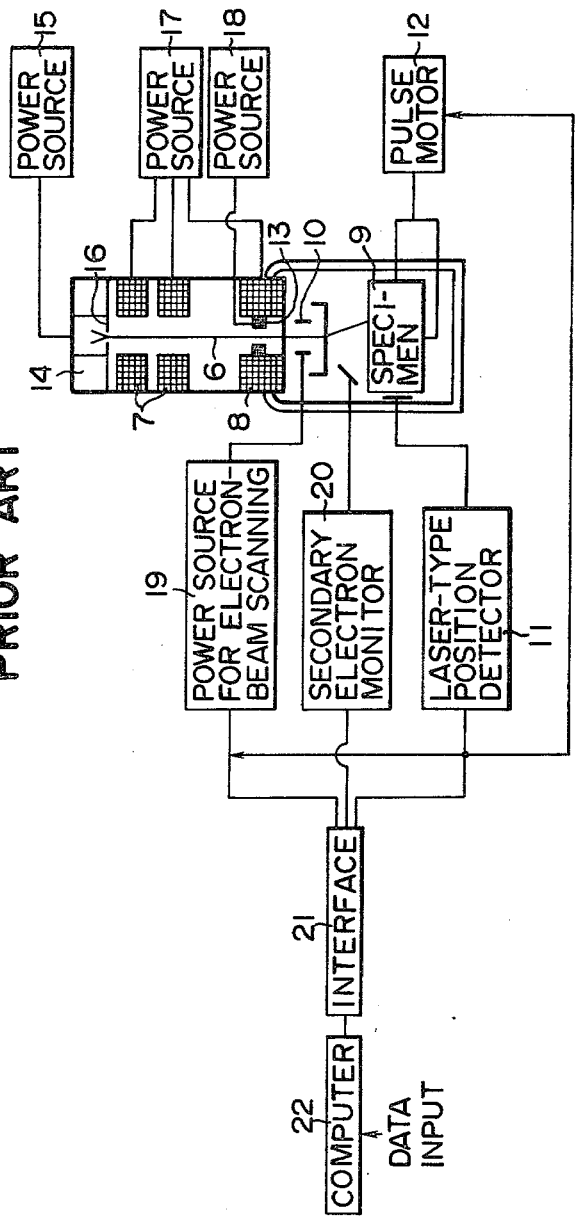
FIG. 2 is a diagram of an electron lens system of FIG. 1.

As shown in FIG. 2, a schematic diagram showing the conventional electron lens of FIG. 1 in use for electron beam exposure device for LSI(Large Scale Integrated circuit) microfabrication, such a conventional electron lens is used as a condenser lens 7 and an objective 8 that are employed, for example, in electron-beam exposure device for exposing LSI pattern on the surface of a specimen 9 of such as silicon wafer. To scan the electron beam over an extensive area across the specimen 9, however, by swinging the single electron beam 6, without moving the specimen 9, it is necessary to increase the deflection angle of the electron beam 6 or the distance between the objective 8 and the specimen 9.

Usually, however, increasing the deflection angle of an electron beam increases deflective aberrations, which are expressed by the following equations, whereby a blurred or distorted image is reproduced.

By assuming that a deflector 10 is placed in an ideal, uniform, paralleled magnetic field, deflective aberrations $\Delta x_1$ and $\Delta y_1$ are expressed as follows:

$$\Delta x_1 = -A\alpha^2 x_s + B\alpha^2 x'_s + C\alpha x'_s y'_s - \alpha x_s y'_s$$

$$\Delta y_1 = -D\alpha^3 + E\alpha^2 y'_s + F\alpha x'^2_s - \alpha x_s x'_s - G\alpha y'^2_s$$

where $\alpha$ = deflection angle, A through G = functions of the widths of deflector magnetic fields and the distances between the specimen 9 and the deflector magnetic fields, $x_s$ and $y_s$ = the abscissa and ordinate before the incidence of the electron beam 6 into the deflector magnetic fields, and $x'hd s$ and $y'_s$ = inclinations of the electron beam 6 with respect to the optical axis (Z axis).

Furthermore, $x_s$, $y_s$, $x'_s$ and $y'_s$ are expressed as follows:

$$x_s = r \cos\chi$$

$$x'_s = -\omega \cos\chi$$

$$y_s = r \sin\chi$$

$$y'_s = -\omega \sin\chi$$

where r = radius vector, $\chi$ = inclination, and $\omega$ = aperture angle of the electron beam 6.

As understood from the above equations, the deflection angle $\alpha$ and the inclination of the electron beam 6 relative to the optical axis or the aperture angle $\omega$ thereof should be limited in order to hold the deflective aberrations $\Delta x_1$ and $\Delta y_1$ within certain limits. Without this limitation, a blurred or distorted image will be reproduced.

To lengthen the distance between the objective 8 and the specimen 9, the focal length of the objective 8 should be increased. But the increased focul length increases a coefficient of aperture aberrations such as spherical aberration, which makes it difficult to focus the electron beam 6 as desired.

For this reason, in making electron beam exposure device for LSI pattern with the conventional electron lenses 7 and 8 as shown in FIG. 2, the scanning area of the electron beam 6 or the pattern width has been reduced to an extent that is free from the influence of deflective and aperture aberrations. At the same time, it has been practiced to mechanically move the specimen 9 back and forth repeatedly, by use of a laser-type position detector 11, a pulse motor 12, etc., so that the whole LSI pattern be exposed on the specimen 9.

In addition, the objective 8 incorporates a stigmator 13 to increase the accuracy of pattern exposure.

In FIG. 2, reference numeral 14 designates an electron gun that produces the electron beam 6, connected to a power source 15, 16 an anode that accelerates the electron beam 6, 17 a power source for the electron lenses 7 and 8, 18 a power source for the stigmator 13, 19 a power source for electron-beam scanning that scans the electron beam 6, connected to the deflector 10, 20 a secondary electron monitor, 21 an interface incorporating a D-A converter, signal converter, etc. for converting control signals from a computer 22 into signals suited for the position detector 11, the power source for electron-beam scanning 19 and the secondary electron monitor 20.

However, this type of electron beam exposure device for LSI pattern means using the conventional electron lenses necessitates troublesome, repeated shifting of the specimen 9 because its pattern irradiation is performed by simply swinging the single electron beam 6. This results in increased exposure time, which in turn greatly lowers the efficiency of the pattern exposure operation.

Figure 3:
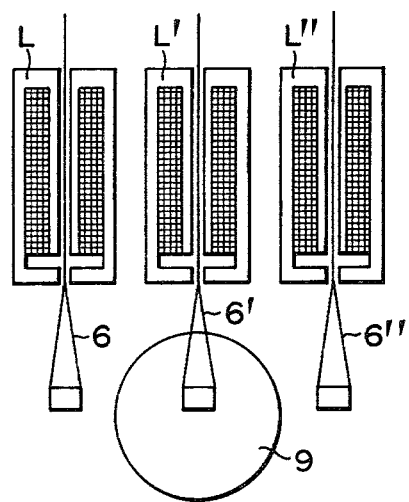
FIG. 3 is a longitudinal cross section view of a known electron lens.

It may then be conceived to decrease the shifting frequency of the specimen 9 by simultaneously irradiating electron beams 6, 6' and 6" thereon that are produced by conventional electron lenses L, L' and L" (see FIG. 1) arranged in parallel as shown in FIG. 3. But, as will be seen in FIG. 3, the simultaneously scanned areas are spaced considerably apart from each other because of the size limitation of the individual electron lenses L, L' and L". Consequently, it becomes impossible to give simultaneous pattern exposure over the entire area of the specimen 9.

Figure 4:
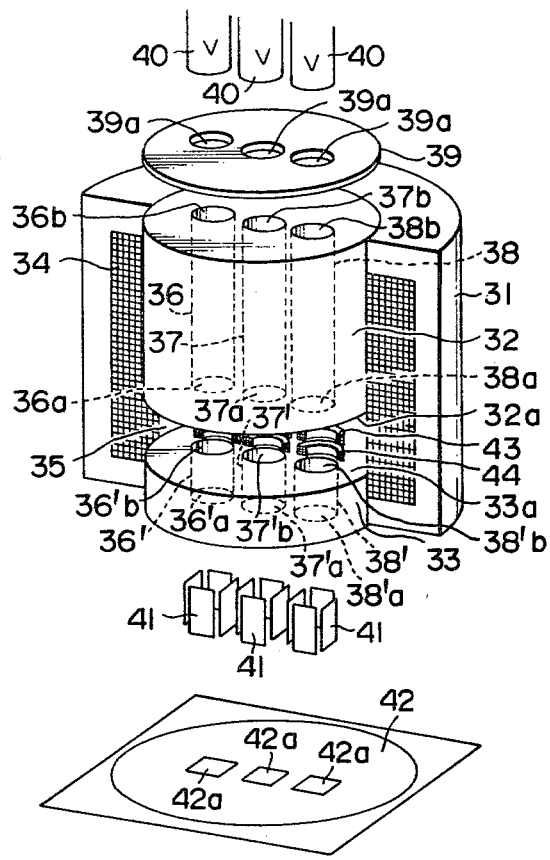
FIG. 4 is a perspective view partly in section of an electron lens according to the present invention.
Figure 5:
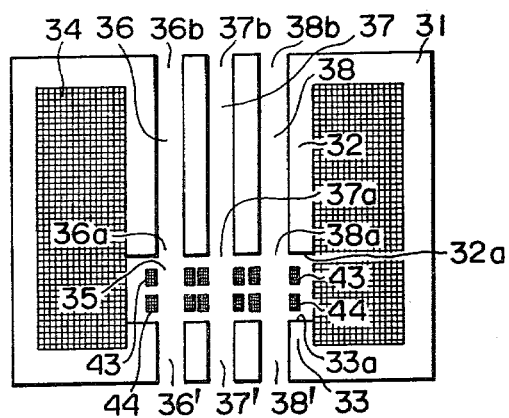
FIG. 5 is a longitudinal cross section view of the electron lens of FIG. 4.

As shown in FIGS. 4 and 5, there are formed a columnar upper projection 32 extending from the top wall of a hollow cylindrical yoke 31 of pure iron to the inside thereof, and a lower projection 33 with a magnetic pole surface 33a that is opposite to a magnetic pole surface 32a of the upper projection 32, extending from the bottom wall of the yoke 31 to the inside thereof.

A main exciting coil 34 is wound around the projections 32 and 33, with both ends of the main exciting coil 34 being connected to a d.c. power source not shown.

Therefore, a magnetic field is produced in a space 35 between the magnetic pole surface 32a of the upper projection 32 and the magnetic pole surface 33a of the lower projection 33 by passing current to the main exciting coil 34.

The upper projection 32 is perforated with three electron beam paths 36 through 38, whereas the lower projection 33 also is perforated with three electron beam paths 36' through 38' which have upper openings 36'b through 38'b opposite to lower openings 36a through 38a of said electron beam paths 36 through 38. The electron beam paths 36 through 38 and 36' through 38' are perforated perpendicular to the magnetic pole surfaces 32a and 33a of the projections 32 and 33.

As shown in FIG. 4, an anode 39 having three openings 39a, which correspond to the upper openings 36b through 38b of the electron beam paths 36 through 38, is mounted on the yoke 31, and an electron gun 40, acting as an electron beam source, is disposed opposite to each opening 39a.

In this embodiment, as many electron guns as electron beam paths are used as the electron beam source. It is also possible to divide an electron beam flux generated from a large electron source, comprising a disc of oxide etc., through a multi-perforated member into a plurality of electron beams, or to divide a single electron beam into a plurality of irradiating electron beams after diverging it through a suitable electron lens.

Three scanning deflectors 41 are disposed under the yoke 31, in positions opposite to lower openings 36'a to 38'a of the electron beam paths 36' to 38', so that the three irradiating electron beams, which have passed through the electron beam paths 36 to 38 and 36' to 38', are scanned to draw desired patterns on a specimen 42.

The electron-beam pattern irradiation by the deflectors 41 is controlled by a computer that is connected thereto through a power source for electron-beam scanning and an interface not shown.

As shown in FIGS. 4 and 5, three each stigmators 43 and auxiliary exciting coils 44 are provided in the space 35, common to the several electron beam paths 36–38, and 36'-38', the former above the latter, in positions corresponding to the three electron beam paths 36 to 38 and 36' to 38', whereby the astigmatism and focus of each irradiating electron beam can be adjusted individually.

The stigmators 43 and auxiliary exciting coils 44 are connected to respective power sources (not shown).

When the multiple electron lens of this invention thus composed is used for directly exposing LSI patterns on the specimen 42 of, for example, silicon wafer coated with photoresist or other material, the electron guns 40 first emit irradiating electron beams as shown in FIG. 4.

After being accelerated by the anode 39, the electron beams pass through the corresponding electron beam paths 36 through 38 in the upper projection 32, and their astigmatism is corrected by the stigmators 43 disposed in the space 35. Then, the main exciting coil 34 and auxiliary exciting coils 44 act upon to focus them accurately.

Thence, the electron beams pass through the corresponding electron beam paths 36' through 38' in the lower projection 33, and are scanned by the deflectors 41 to reproduce desired patterns 42a on the specimen 42.

As understood, the three irradiating electron beams can simultaneously reproduce three desired patterns 42a on the surface of the specimen 42.

The scanning area of the electron beam and the pattern width are set within such limits as are free from the influence of deflective and aperture aberrations; usually the scanning area at about 2 mm by 2 mm and the pattern width at about 1 $\mu$m.

Figure 6:
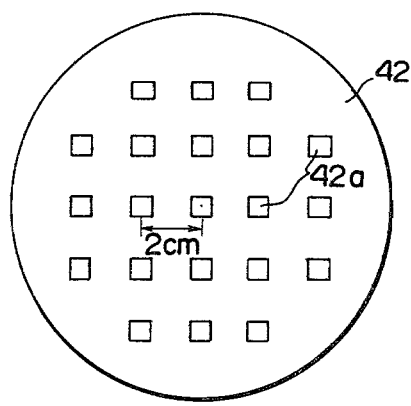
FIG. 6 is a plan view of a diagram for illustrating operation of an electron lens according to the present invention.

For example, when the specimen 42 is a disc with about 10 cm diameter as shown in FIG. 6, it is possible to provide as many as twenty-one electron beam paths in the projections 32 and 33 because they do not need to be spaced more than 2 cm from each other, even considering the space to accommodate the stigmators 43 and auxiliary exciting coils 44 (see FIGS. 4 and 5).

This permits simultaneous pattern exposure at twenty-one blocks, which naturally affords much greater operating efficiency as compared with a single electron beam.

When the plurality of patterns have been exposed, the specimen 42 is moved suitably by a pulse motor (not shown), by detecting its position with a laser-type position detector etc. Then the patterns are exposed thereon following the same procedure.

By repeating the same procedure, the patterns are efficiently and quickly exposed over the entire surface of the specimen 42.

Figure 7:
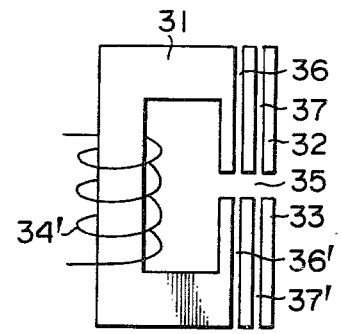
FIGS. 7 to 9 inclusive are elevation cross section views of other embodiments of a lens system according to the present invention.
Figure 8:
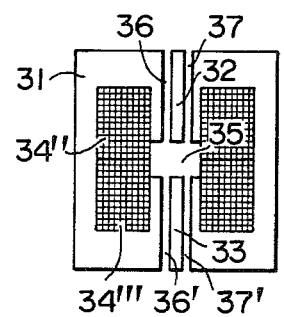
Figure 9:
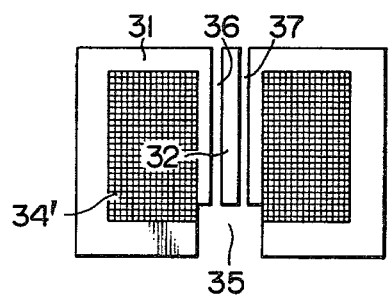

FIGS. 7 through 9 illustrate other multiple electron lenses embodying the principle of this invention. In FIGS. 7 through 9, similar reference numerals designate similar parts shown in FIGS. 4 and 5. All these embodiments are provided with two electron beam paths.

A multiple electron lens of FIG. 7 has a main exciting coil 34' that is wound around only one side of the yoke 31. Meanwhile, the main exciting coil of a multiple electron lens of FIG. 8 consists of coaxial, composite coils 34'' and 34'''.

A multiple electron lens of FIG. 9 has two electron beam paths 36 and 37 perforated only in the upper projection 32 of the yoke 31.

The multiple electron lenses shown in FIGS. 7 to 9 exhibit substantially the same operations and results as the embodiment shown in FIGS. 4 through 6.

The magnetic field in the space 35 may be produced by use of either electromagnet or permanent magnet.

As described heretofore, the multiple electron lens according to this invention has a plurality of electron beam paths 36–38 and 36'–38' in at least one of opposite magnetic pole surfaces 32a and 33a, and a sole anode having a plurality of through openings 39a aligned coaxially with the electron beam paths 36 to 38 and 36' to 38' so that a plurality of irradiating electron beams are generated. This arrangement improves a simplification and compactness and permits exposing a plurality of patterns at a time on the surface of a single specimen. Therefore, given that the number of electron beam paths is n, the exposure time is reduced to (1/n) of that required by the conventional electron lens as shown in FIG. 1. The result is a sharp reduction in exposure time and a marked improvement in operating efficiency.

Furthermore, provision of a stigmator and an auxiliary exciting coil 44 adjacent to each other coaxially and coaxial with corresponding beam paths in the space between the polepieces. This permits the multiple electron lens of this invention to perform suitable astigmatism correction and focusing correction with respect to each individual irradiating electron beam. Furthermore, this arrangement facilitates manufacture of the electron lens and maintenance thereof because of the compactness. Consequently, accurate patterns are always reproduced on the specimen.

What is claimed is:

1. A multiple electron lens comprising a cylindrical yoke, a main exciting coil in said yoke, a multiple electron lens in said main coil having two axially spaced polepieces defining a space therebetween, each polepiece having axial through openings and said polepieces positioned with respective pairs of through openings through said axially spaced polepieces aligned axially and each aligned pair of through openings defining an electron beam path, a sole anode disposed coaxially with the polepieces spaced axially therefrom and having openings corresponding in number to the openings in the polepieces and aligned therewith, for each beam path an auxiliary exciting coil in said space coaxial with a corresponding beam path, for each beam path a stigmator coaxial with a corresponding auxiliary coil and adjacent thereto.

2. A multiple electron lens comprising two axially spaced polepieces each having a plurality of axial through openings with corresponding through openings of said two polepieces aligned coaxially for defining a plurality of electron beam paths each through a respective pair of aligned through openings, the spaced polepieces defining a space therebetween, a sole anode disposed coaxially with the polepieces spaced axially therefrom and having openings corresponding in number to the openings in the polepieces and aligned therewith, for each beam path an auxiliary exciting coil in said space coaxial with a corresponding beam path, for each beam path a stigmator coaxial with a corresponding auxiliary coil and adjacent thereto.

* * * * *